United States Patent [19]

Gendai

[11] Patent Number: 5,548,287
[45] Date of Patent: Aug. 20, 1996

[54] ANALOG TO DIGITAL CONVERTER

[75] Inventor: Yuji Gendai, Kanagawa, Japan

[73] Assignee: Sony Corporation, Tokyo, Japan

[21] Appl. No.: 257,150

[22] Filed: Jun. 9, 1994

[30] Foreign Application Priority Data

| Jun. 17, 1993 | [JP] | Japan | 5-172595 |
| Jun. 24, 1993 | [JP] | Japan | 5-180893 |
| Jun. 24, 1993 | [JP] | Japan | 5-180895 |
| Jun. 24, 1993 | [JP] | Japan | 5-180896 |

[51] Int. Cl.$^6$ .............................. H03M 1/00; H03F 1/14
[52] U.S. Cl. ......................... 341/133; 341/155; 330/292
[58] Field of Search .................................. 341/155, 156, 341/158, 159, 133, 135; 327/484, 486, 489, 490, 491; 330/156, 292

[56] References Cited

U.S. PATENT DOCUMENTS

| 4,706,039 | 11/1987 | Dijkmans et al. | 330/156 |
| 4,804,941 | 2/1989 | Yoshii | 341/155 |
| 4,885,548 | 12/1989 | Wakimoto | 330/292 |
| 5,245,222 | 9/1993 | Carobolante | 327/484 |
| 5,291,198 | 3/1994 | Dingwall et al. | 341/159 |
| 5,416,484 | 5/1995 | Lofstrom | 341/159 |

FOREIGN PATENT DOCUMENTS

| 293833 | 7/1988 | European Pat. Off. . | |
| 0324525 | 7/1989 | European Pat. Off. | 330/292 |
| 61-210722 | 9/1986 | Japan . | |
| 62-141820 | 6/1987 | Japan . | |
| 01168104 | 7/1989 | Japan . | |
| 3143024 | 6/1991 | Japan . | |
| 5063547 | 3/1993 | Japan . | |
| 05083117 | 4/1993 | Japan . | |

*Primary Examiner*—Howard L. Williams
*Attorney, Agent, or Firm*—Ronald P. Kananen

[57] ABSTRACT

A plurality of comparators are arranged in parallel, and novel constructions are employed for emitter followers or like circuits of input circuits of the comparators or for reference voltage supplying circuits for use for those circuits, thereby to improve the differential linear distortion or some other characteristic and reduce noise without the input capacitance. Further, an ECL circuit for use for signal processing is provided with a power saving function to reduce the power dissipation.

11 Claims, 12 Drawing Sheets r-q CHARACTERISTIC DIAGRAM

ANALOG TO DIGITAL CONVERTER

BACKGROUND OF THE INVENTION

1. Field of the Invention

This invention relates to an analog to digital converter which includes a plurality of comparators for comparing an analog input voltage with comparison voltages as reference voltages having different voltage values, and more particularly to an analog to digital converter of the type mentioned which includes an ECL circuit which is used in an emitter follower circuit or a processing circuit employed at an input stage of each comparator.

2. Description of the Related Art

An analog to digital converter of the parallel comparison type called a flash analog to digital converter having a construction wherein a number of comparators, which have comparison voltages of different voltage values equal to the number of bits of a digital signal, are arranged for collectively determining the comparison voltages to find a reference voltage equal to an analog input voltage, commonly employs, at an input stage of each of the comparators, an emitter follower circuit which has the characteristics that the input impedance is comparatively high and that it is superior in interference suppressing capability for the preceding and following stages.

An example of the construction of an analog to digital converter of the parallel comparison type is shown in FIG. 1. Referring to FIG. 1, a reference voltage generation circuit 1 includes, where a digital signal is constituted from, for example, 8 bits, 256 resistors $r_1$ to $r_{256}$ connected in series, for example, between lines $V_{RT}$ and $V_{RB}$ and generates reference voltages of different voltage values at 255 junctions between adjacent ones of the resistors by potential division of the resistors.

The reference voltages serve as comparison voltages for 255 comparators COP1, . . . of a comparison circuit 2. An analog input voltage $V_{IN}$ is inputted commonly as an object voltage for comparison to the 255 comparators COP1, . . . . The 255 comparators COP1, . . . collectively determine one of the comparison voltages which is equal to the input voltage VIN.

The comparison outputs of the comparators COP1, . . . are supplied by way of a gate circuit 3 to an encoder 4, by which they are converted into a digital signal D1 to D8 of 8 bits to be outputted.

A conventional example of the circuit construction of the comparators of the analog to digital converter of the parallel comparison type described above is shown in FIG. 2.

Referring to FIG. 2, an NPN transistor Q1 of an emitter follower stops to the base of which an analog input voltage $V_{IN}$ is inputted, another NPN transistor Q2 to the base of which a bias voltage $V_{BIAS}$ is inputted and a resistor R1 are connected in series between a GND line and a $V_{EE}$ line to construct an emitter follower stage 11 on the analog input side.

A further NPN transistor Q3 of another emitter follower to the base of which a reference voltage $V_{REF}$ is inputted, a still further NPN transistor Q4 to the base of which the bias voltage $V_{BIAS}$ is inputted and another resistor R2, are connected in series between the GND line and the $V_{EE}$ line to construct an emitter follower stage 12 on the reference voltage input side.

Meanwhile, a pair of differential transistors Q5 and Q6 whose emitters are connected common to perform a differential operation, a pair of resistors R3 and R4 connected between the collectors of the differential transistors Q5 and Q6 and the GND line, respectively, and a constant-current transistor Q7 and a resistor R5 connected in series between a common junction between the emitters of the differential transistors Q5 and Q6 and the $V_{EE}$ line construct a differential amplifier 13.

In the differential amplifier 13, the analog input voltage $V_{IN}$ is applied by way of the emitter follower stage 11 to the base of the transistor Q5 of the differential transistor pair, and the reference voltage $V_{REF}$ is applied to the other transistor Q6 by way of the emitter follower stage 12. Comparison outputs are thus led out from the collectors of the differential transistors Q5 and Q6.

Subsequently, a second related art will be described.

An ECL output circuit having such a construction as shown in FIG. 3 is conventionally known as an ECL output circuit which has a power saving function.

Referring to FIG. 3, a pair of differential transistors Q11 and Q12 whose emitters are connected in common to perform a differential operation, a pair of resistors R11 and R12 connected between the collectors of the differential transistors Q11 and Q12 and a GND terminal 21, and a transistor Q13 and a resistor R13 connected in series between a common junction between the emitters of the differential transistors Q11 and Q12 and a $V_{EE}$ power source terminal 22, respectively, construct a differential amplifier 23.

In the differential amplifier 23, the bases of the differential transistors Q11 and Q12 are connected to input terminals 24 and 25, respectively.

During power saving (PS) operation, a PS Signal is supplied to a reference voltage circuit 27 by way of a control terminal 26. The reference voltage circuit 27 applies, when a power saving operation is not to be performed, a predetermined reference voltage to the base of the transistor Q13 to turn the transistor Q13 into an on-state, but when a power saving operation is to be performed, the reference voltage circuit 27 turns the transistor Q13 into an off-state in response to the PS signal.

Two outputs of the differential amplifier 23 are supplied to another differential amplifier 30 at the last stage by way of a pair of emitter follower circuits 28 and 29.

The emitter follower circuit 28 includes a transistor Q14 whose collector is connected to the GND terminal 21 and whose base receives one of the two outputs of the differential amplifier 23, another transistor Q15 connected in a diode connection with the collector and the base thereof connected in common to the emitter of the transistor Q14, and a further transistor Q16 and a resistor R14 connected in series between the emitter of the transistor Q15 and the $V_{EE}$ power source terminal 22.

The emitter follower circuit 29 similarly includes a transistor Q17, another transistor Q18 connected in a diode connection, a further transistor Q19 and a resistor R15.

A predetermined bias voltage $V_{BIAS}$ is applied from a variable voltage source 31 to the bases of the transistors Q16 and Q19.

The differential amplifier 30 includes a pair of differential transistors Q20 and Q21 whose emitters are connected in common to perform a differential operation, a resistor R16 connected between the collector of the transistor Q21 and the GND terminal 21, and a transistor Q22 and a resistor R17 connected in series between a common junction between the emitters of the differential transistors Q20 and Q21 and the $V_{EE}$ power source terminal 22.

The predetermined bias voltage $V_{BIAS}$ from the variable voltage source 31 is applied also to the base of the transistor Q22. The variable voltage source 31 is constructed so as to stop, upon power saving operation, generation of the bias voltage $V_{BIAS}$ in response to a PS signal. Consequently, during power saving operation, the transistors Q16, Q19 and Q22 are put into an off-state.

The collector output of the transistor Q21 is led out from an output terminal 32 by way of an output transistor Q23.

In the emitter follower circuit 11 at the analog input stage of the construction described above in FIG. 2, since the emitter of the transistor Q1 has a parasitic capacitance $C_p$, there is a problem in that, if the through rate of the input voltage $V_{IN}$ is high, then the base-emitter voltage $V_{BE}$ of the transistor Q1 is varied by a charging or discharging current flowing through the parasitic capacitance $C_p$, which gives rise to distortion in the emitter voltage of the transistor Q1.

Meanwhile, in the analog to digital converter of the parallel comparison type, a number of, for example, 255 in the case of 8 bits, comparators of the construction wherein the emitter follower stages 11 and 12 and the differential amplifier 13 are provided in a one by one corresponding relationship are arranged in parallel to the analog input voltage $V_{IN}$.

However, in the comparator of the construction described above, since high currents flow, upon switching of the differential amplifier 13, through the bases of the differential transistors Q5 and Q6 and such current changes have a significant influence on the emitter current of the emitter follower stage 11, the conversion accuracy in analog to digital conversion is deteriorated.

In order to reduce the influence of kickback noise from the differential amplifier, the current to flow through the emitter follower stage 11 should be increased in. This, however, will give rise to an increase the current consumption.

In an ideal analog to digital converter, an analog input voltage has the width of one LSB (Least Significant bit) for one digital code. In an actual analog to digital converter, the width may be greater or smaller than one LSB. The variation in width appears as a differential linear distortion (DLE).

In order to reduce the differential linear distortion in the analog to digital converter of the parallel comparison type of the construction described above, it is required to effectively reduce the difference $\Delta V_{BE}$ between the base-emitter voltages $V_{BE}$ of the transistors Q1 and Q3 of the emitter follower stages 11 and 12 constituting the input stages of each comparator.

A conventional countermeasure for such effective reduction of the difference $\Delta V_{BE}$ between the base-emitter voltages $V_{BE}$ of the transistors Q1 and Q3 of the emitter follower stages 11 and 12 is to increase the size of each of the transistors Q1 and Q3.

However, if the transistors Q1 and Q3 of the emitter follower stages 11 and 12 are increased in size, then another problem takes place in that the input capacitance which has a significant influence on the conversion rate upon analog to digital conversion is increased, resulting in deterioration of the conversion accuracy.

Besides, since the difference $\Delta V_{BE}$ cannot be reduced below a limit provided by a process, there is a limitation in reduction of the differential linear distortion.

Further, in the ECL output circuit of the related art of the construction described above in FIG. 3, there is a problem in that, when the power saving function operates, the output level of the output transistor Q23 rises to a high level, resulting in an increase of the power dissipation at the terminal end of the output.

In particular, when the bias voltage $V_{BIAS}$ of the variable voltage source 31 approaches $V_{EE}$ during power saving operation, the transistor Q22 is turned into an off-state. Consequently, only the base current of the output transistor Q23 flows through the resistor 16 so that the base potential of the transistor Q23 becomes substantially equal to 0 V, and as a result, the output level of the transistor Q23 changes to a high level.

Here, if it is assumed that the present circuit terminates, for example, in a $V_{TT}$ power source of −2 V by way of a resistor of 50Ω as indicated by a dotted line in FIG. 3, then when the high level is −0.9 V, since the potential difference between the opposite ends of the resistor of 50Ω is 1.1 V, a current of 22 mA flows through the resistor of 50Ω, but when the low level is −1.8 V, since the potential difference between the opposite ends the resistor of 50Ω is 0.2 V, a current of 4 mA flows through the resistor of 50Ω.

Accordingly, between the high level output and the low level output, a power dissipation difference of 36 mW (=18 mA×2 V) is produced for each output terminal.

OBJECTS AND SUMMARY OF THE INVENTION

It is a first object of the present invention to provide an emitter follower circuit which minimizes analog distortion arising from a parasitic capacitance.

It is a second object of the present invention to provide an analog to digital converter which can reduce the influence of kickback noise from a differential amplifier without increasing the number of elements or the power dissipation of the circuit.

It is a third object of the present invention to provide an analog to digital converter which can reduce the differential linear distortion without increasing the input capacitance only by adding a simple circuit.

It is a fourth object of the present invention to provide an ECL output circuit which can reduce the power dissipation upon power saving operation only by adding a circuit.

DETAILED DESCRIPTION OF THE PREFERRED EMBODIMENTS

In the following, several embodiments of the present invention will be described in detail with reference to the drawings.

Figure 4:
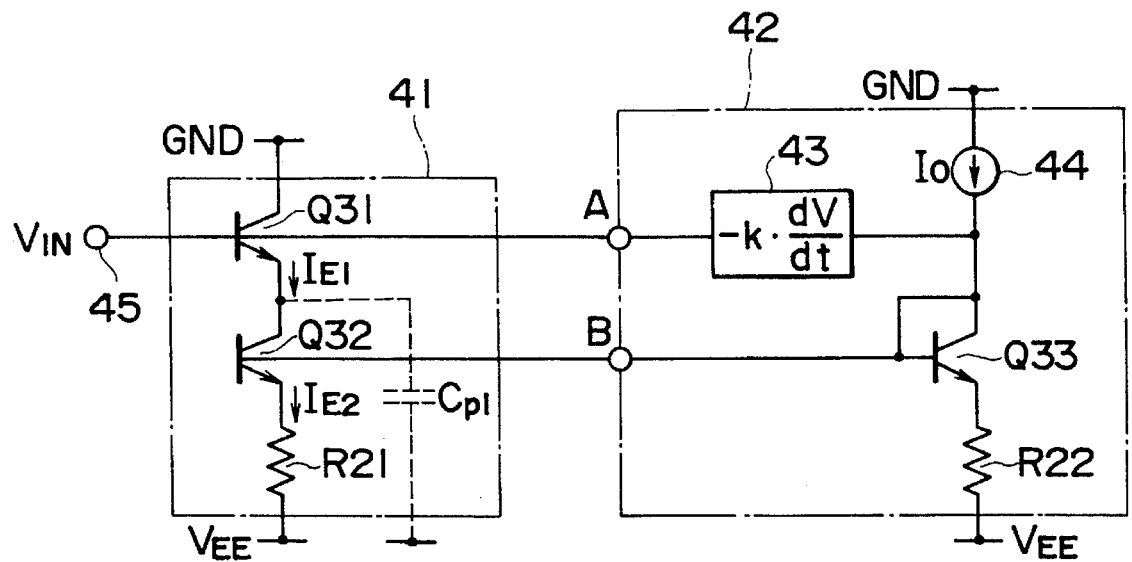
FIG. 4 is a circuit diagram showing an emitter follower circuit which is a first embodiment of the present invention.

FIG. 4 is a circuit diagram showing a first embodiment of an emitter follower circuit according to the present invention. Referring to FIG. 4, an NPN transistor Q31 of an emitter follower to whose base an input voltage $V_{IN}$ is inputted, another NPN transistor Q32 which serves as a load to the transistor Q31 and also as a variable current source, and a resistor R21 are connected in series, for example, between a pair of power source lines of a ground GND and a negative power source $V_{EE}$ to construct an emitter follower stage 41.

In the emitter follower stage 41, the emitter of the transistor Q31 has a parasitic capacitance $C_{P1}$.

The input voltage $V_{IN}$ is applied also to a terminal A of a control circuit 42. An input terminal of a differentiation circuit 43 is connected to the terminal A. The differentiation circuit 43 differentiates the input voltage $V_{IN}$ to convert the voltage variation into a current variation.

In the control circuit 42, a constant-current source 44, an NPN transistor Q33 connected in a diode configuration and a resistor R22 are connected in series between the GND line and the power source $V_{EE}$ line. An output terminal of the differentiation circuit 43 is connected to a junction between the constant-current source 44 and the collector (base) of the transistor Q33.

The transistor Q33 connected in a diode connection is connected to the transistor Q32 of the emitter follower stage 41 commonly at the their bases by way of a terminal B to construct a current mirror circuit.

In the emitter follower circuit of the construction described above, if the emitter current of the transistor Q31 of the emitter follower stage 41 is represented by $I_{E1}$; the emitter current of the transistor Q32 by $I_{E2}$; the parasitic capacitance by $C_{P1}$; the coefficient of the differentiation circuit 43 by k; and the current of the constant-current source 44 by $I_0$, the following equation stands:

$$\begin{aligned} I_{E1} &= I_{E2} + C_{P1} \cdot (dV_{IN}/dt) \\ &= I_0 - k \cdot (dV_{IN}/dt) + C_{P1} \cdot (dV_{IN}/dt) \end{aligned} \quad (1)$$

Here, the constant k of the differentiation circuit 43 is equal to 0 when no current correction is performed, and in this instance, a charging current which increases in proportion to the through rate of the input voltage $V_{IN}$ flows through the transistor Q31 of the emitter follower stage 41. On the other hand, when $k=C_{p1}$, $I_{E1}=I_0$, and accordingly, the emitter current IE1 of the transistor Q31 is fixed irrespective of the through rate of the input voltage $V_{IN}$.

Since the emitter current $I_{E1}$ of the transistor Q31 can be adjusted in response to the through rate of the input voltage $V_{IN}$ by differentiating the input voltage $V_{IN}$ by means of the differentiation circuit 43 to convert the voltage variation into a current variation and controlling the current of the transistor Q32, which is a load to the transistor Q31 of the emitter follower stage 41, in response to the current variation as described above, a portion of the current which flows through the parasitic capacitance $C_{p1}$ can be corrected with the through rate of the input voltage $V_{IN}$.

As a result, the variation of the base-emitter voltage $V_{BE}$ of the transistor Q31 caused by a charging or discharging current flowing through the parasitic capacitance $C_{p1}$ can be suppressed, and consequently, an analog distortion which arises from the parasitic capacitance $C_{p1}$ can be reduced.

A second embodiment of the present invention will be described subsequently.

Figure 5:
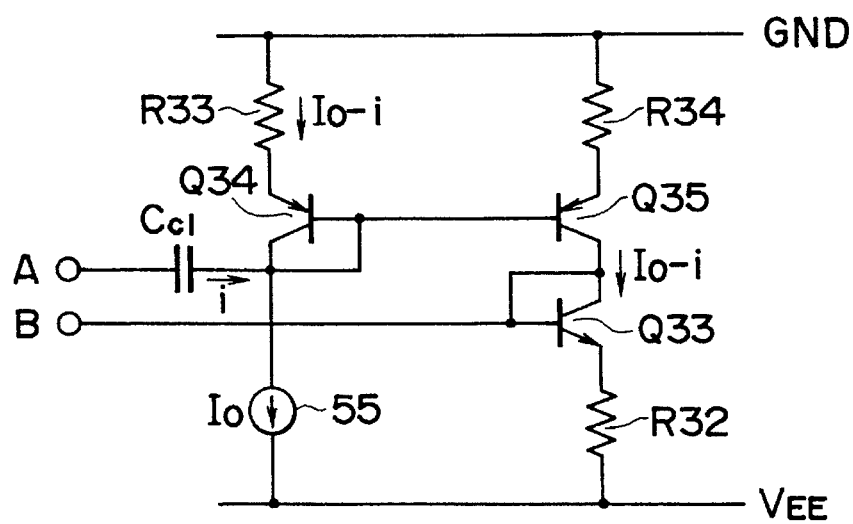
FIG. 5 is a circuit diagram showing an example of the detailed construction of a control circuit which is a second embodiment of the present invention.

FIG. 5 is a circuit diagram of an example of the detailed circuit construction of the control circuit 42 in FIG. 4.

Referring to FIG. 5, a resistor R33, a PNP transistor Q34 connected in a diode configuration and a constant-current source 55 are connected in series between a GND line and a power source $V_{EE}$ line. A capacitor $C_{C1}$ is connected between a junction point between the transistor Q34 and the constant-current source 55 and a terminal A.

Meanwhile, a resistor R34 and a PNP transistor Q35 are connected in series between the GND line and the collector (base) of the NPN transistor Q33. A current mirror circuit is constituted from the transistor Q34 and the transistor Q35.

In such circuit construction, since the collector voltage of the transistor Q34 can be considered to be substantially fixed, the current i flowing in from the capacitance $C_{C1}$ is given by $$i = C_{C1} \cdot (dV_{IN}/dt) \quad (2)$$

and where the current of the constant-current source 55 is represented by $I_0$, a current $I_{0-i}$ flows through the transistor Q34. Since the transistor Q34 and the transistor Q35 construct a current mirror circuit, where the emitter current is represented by $I_{E3}$, the emitter current $I_{E3}$ given by $$\begin{aligned} I_{E3} &= I_0 - i \\ &= I_0 - C_{C1} \cdot (dV_{IN}/dt) \end{aligned} \quad (3)$$

flows into the emitter of the transistor Q33.

Here, if the capacitance $C_{C1}$ is set to $C_{C1}=C_{p1}$, then the emitter current $I_{E1}$ of the transistor Q31 of the emitter follower stage 41 can be made a constant.

In actual use, it is required in most cases to employ the construction wherein n such emitter follower stages 41 are connected to the single control circuit 42.

In this instance, the transistors Q33 and Q35 in the circuit of FIG. 5 should be multiplied by n, and the resistors R32 and R34 should be reduced to 1/n. With the construction, there is an effect in that an analog distortion which arises from the parasitic capacitance $C_{P1}$ in each of the n emitter follower stages 41 can be reduced by the single control circuit 42.

Subsequently, a third embodiment of the present invention will be described.

Figure 6:
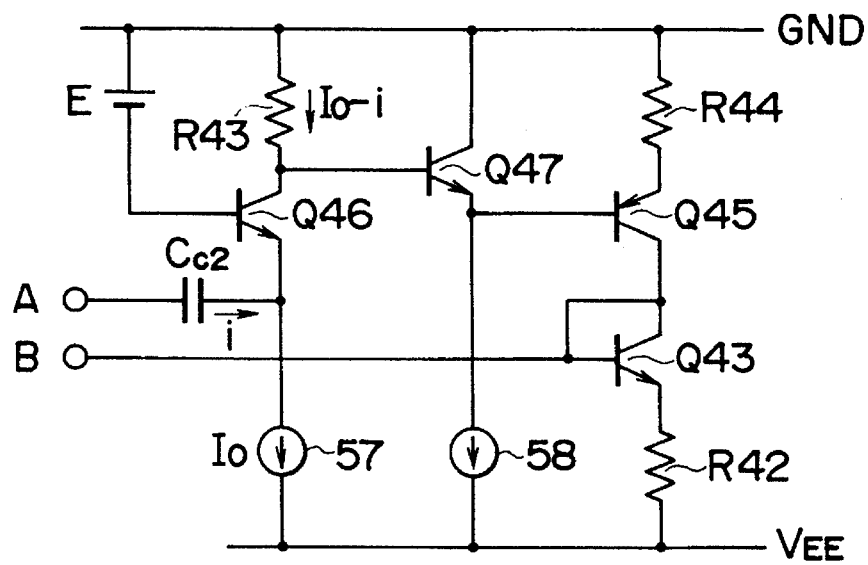
FIG. 6 is a circuit diagram showing an example of the detailed construction of a control circuit which is a third embodiment of the present invention.

FIG. 6 is a circuit diagram showing another example of the detailed circuit construction of the control circuit 42 in FIG. 4.

Referring to FIG. 6, a resistor R43, an NPN transistor Q46 and a constant-current source 57 are connected in series between a GND line and a $V_{EE}$ line. A dc voltage E is applied to the base of the transistor Q46. A capacitor $C_{C2}$ is connected between a junction between the transistor Q46 and the constant-current source 57 and a terminal A.

An NPN transistor Q47 and a constant-current source 58 are connected in series between the GND line and the $V_{EE}$ line. The base of the transistor Q47 is connected to the collector of the transistor Q46.

Meanwhile, a resistor R44 and an PNP transistor Q45 are connected in series between the GND line and the collector (base) of the transistor Q43. The base of the transistor Q45 is connected to the emitter of the transistor Q47.

In such circuit construction described above, since the emitter of the NPN transistor (transistor Q46) is connected to the capacitor $C_{C2}$, there is a characteristic in that the parasitic capacitance is lower than an alternative circuit construction wherein the collector and the base of the PNP transistor (transistor Q34) are connected to each other as in the circuit construction of FIG. 5.

Figure 7:
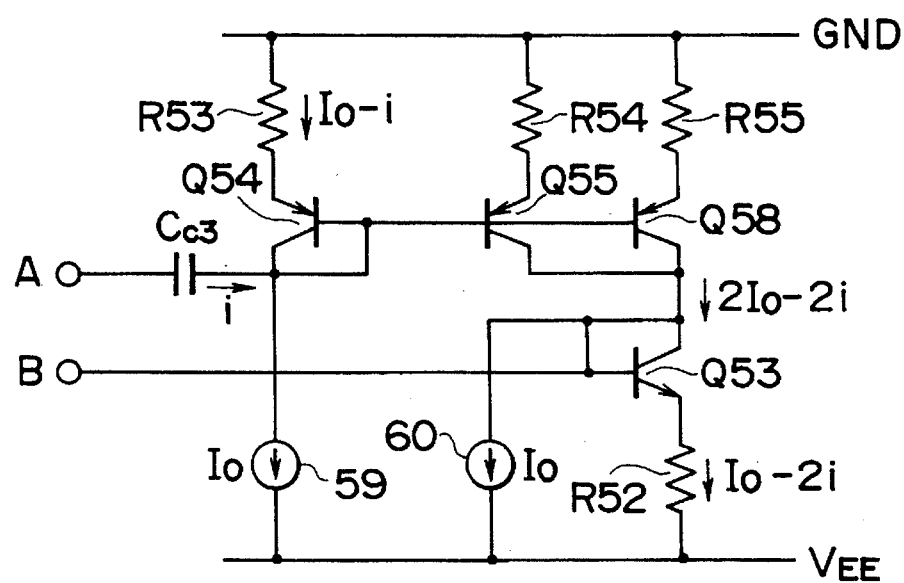
FIG. 7 is a circuit diagram showing an example of the detailed construction of another control circuit which is a fourth embodiment of the present invention.

FIG. 7 is a circuit diagram showing a further example of the detailed circuit construction of the control circuit 42 of FIG. 4.

The present circuit example is provided in order to employ, for the capacitor $C_{C3}$, a capacitor having a different capacitance from the parasitic capacitance $C_{p1}$ and has a circuit construction wherein, in addition to the circuit construction of FIG. 5, a series circuit of a resistor R55 and a PNP transistor Q58 is connected in parallel to a series circuit of a resistor 54 and a PNP transistor Q55 and a constant-current source 60 for a current $I_0$ is connected in parallel to a series circuit of an NPN transistor Q53 and a resistor R52.

In such circuit construction, a current $I_0-i$ flows through the transistor Q54, and another current $I_0-2i$ flows through the transistor Q53.

Accordingly, by employing a capacitor having a capacitance of $C_{C3}=C_{p1}/2$ as the capacitor $C_{C3}$, analog distortion which arises from the parasitic capacitance $C_{p1}$ can be corrected.

In other words, the capacitance of the capacitor $C_{C3}$ can be reduced to one half comparing with that of the circuit construction of FIG. 5.

Figure 1:
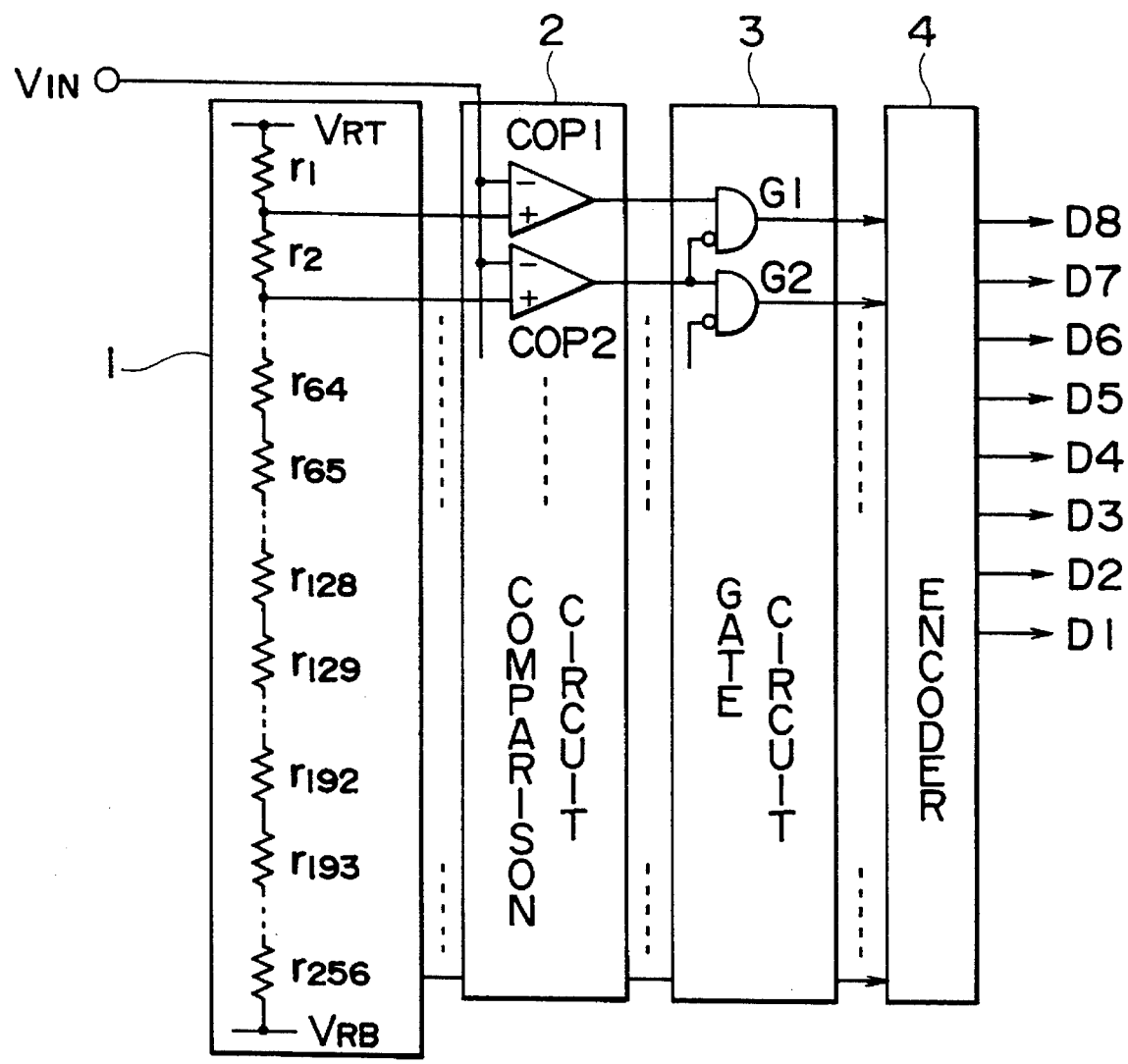
FIG. 1 is a block diagram of an analog to digital converter of the parallel comparison type of the related art.
Figure 2:
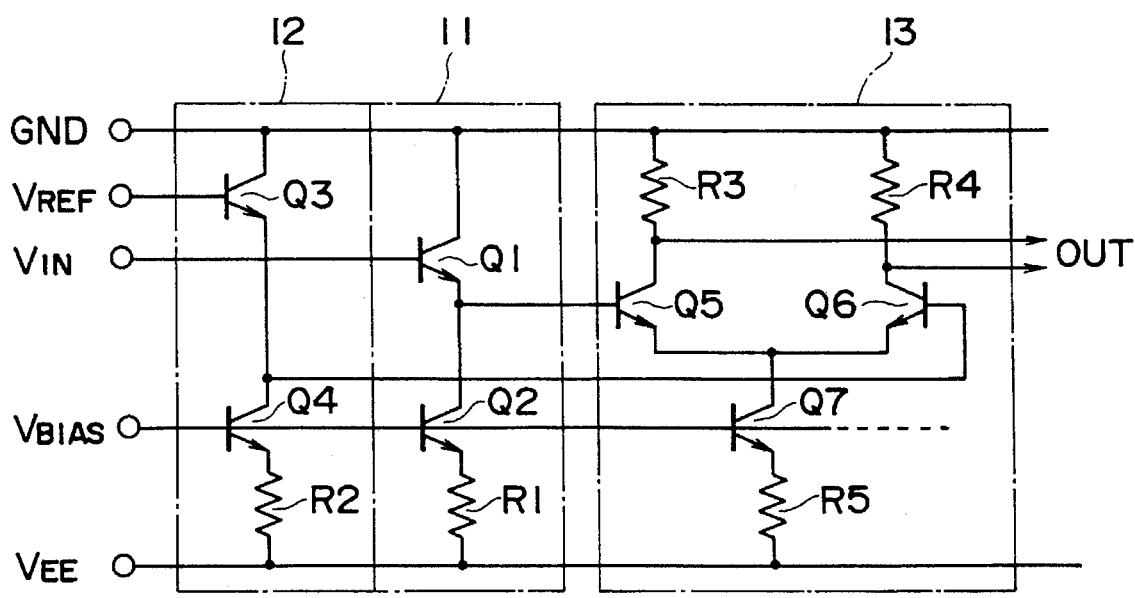
FIG. 2 is a circuit diagram of an emitter follower circuit of the related art which is employed for an input circuit or a like circuit.
Figure 3:
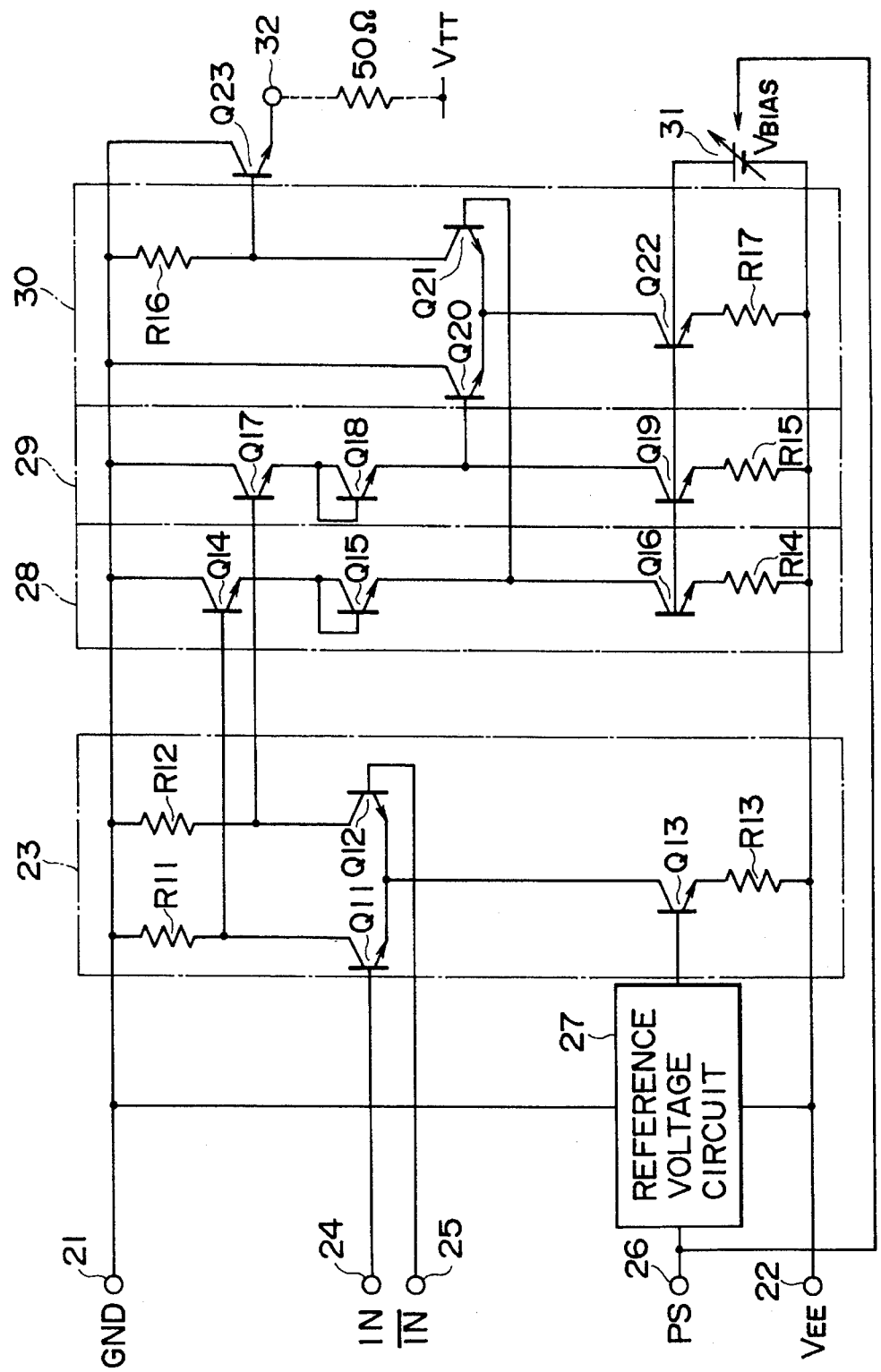
FIG. 3 is a circuit diagram of an ECL circuit of the related art.

The emitter follower circuit according to the present invention which is constructed in such a manner as described hereinabove is employed as a circuit at an input stage of each of comparators of, for example, such an analog to digital converter of the parallel type as shown in FIG. 1.

Referring to FIG. 1, a reference voltage generation circuit 1 includes, where a digital signal is constituted from, for example, 8 bits, 256 resistors r1 to r256 connected in series, for example, between lines $V_{RT}$ and $V_{RB}$ and generates reference voltages of different voltage values at 255 junctions between adjacent ones of the registers by potential division of the resistors.

The reference voltages serve as comparison voltages for 255 comparators COP1, ... of a comparison circuit 2. An analog input voltage $V_{IN}$ is inputted common as an object voltage for comparison to the 255 comparators COP1, .... The 255 comparators COP1, ... collectively determine one of the comparison voltages which is equal to the input voltage $V_{IN}$.

The comparison outputs of the comparators COP1, ... are supplied by way of a gate circuit 3 to an encoder 4, by which they are converted into a digital signal D1 to D8 of 8 bits to be outputted.

With the construction described above, analog distortion of the analog to digital converter of the parallel type which arises from the parasitic capacitance of an emitter follower stage can be improved.

It is to be noted that the present invention can be applied not only to an emitter follower at an input stage of a comparator in an analog to digital converter of the parallel type but also similarly to an amplifier or a like circuit which has an emitter follower circuit at an input stage thereof.

As described so far, according to the present invention, since an input voltage is differentiated to convert the voltage variation into a current variation and the current to flow through an emitter follower stage is controlled in response to the current variation to adjust the emitter current of a transistor of the emitter follower stage in response to the through rate of the input voltage, the variation of the base-emitter voltage $V_{BE}$ of the transistor at the emitter follower stage caused by a charging or discharging current flowing through a parasitic capacitance can be suppressed, and consequently, analog distortion which arises from the parasitic capacitance can be reduced.

Further, since the emitter follower circuit according to the present invention is applied to an emitter follower circuit which is used at an analog input stage of a comparator of an analog to digital converter of the parallel type, analog distortion of the analog to digital converter of the parallel type which arises from the parasitic capacitance at the emitter follower stage can be improved.

Figure 8:
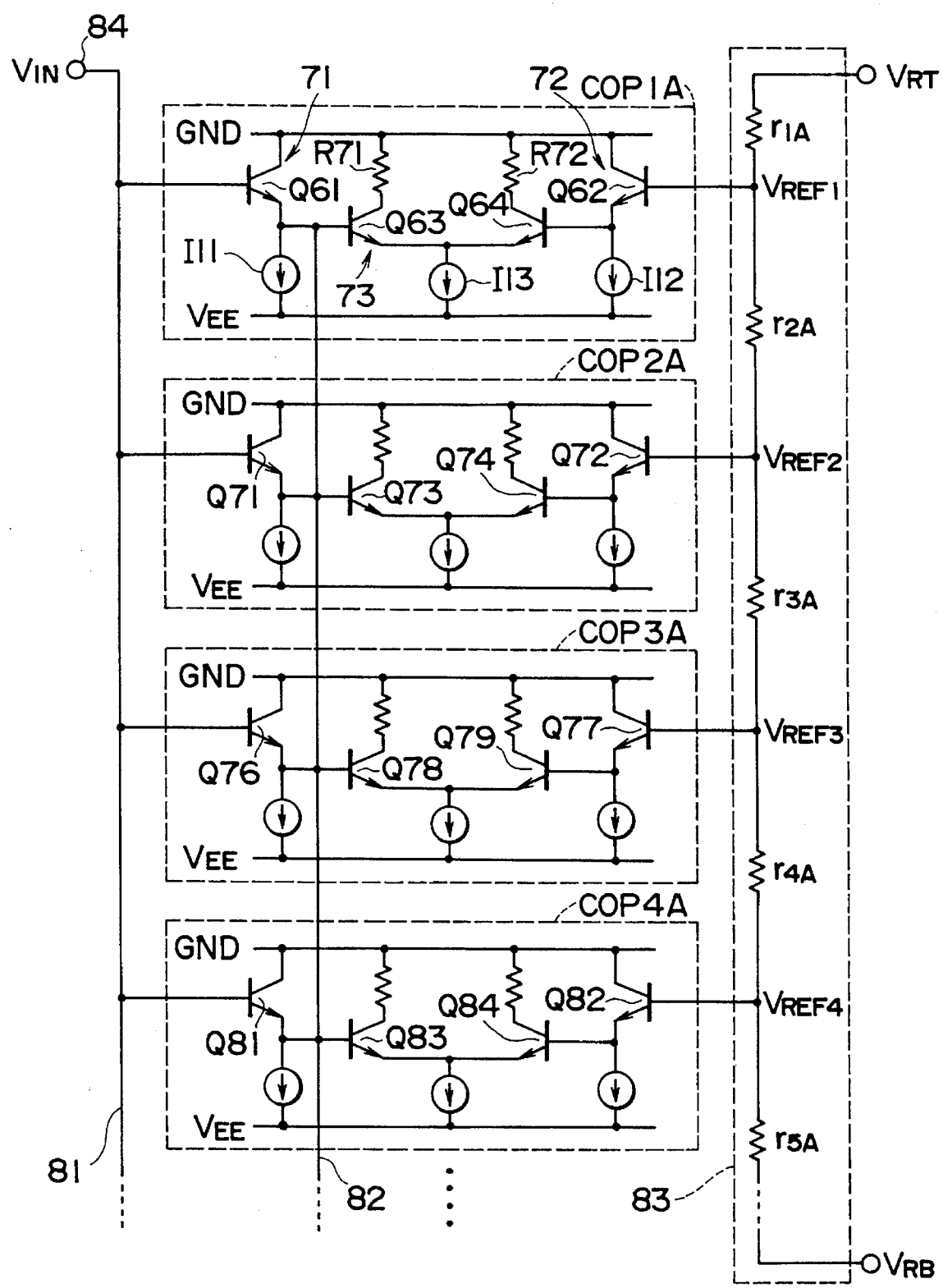
FIG. 8 is a circuit diagram showing a fifth embodiment of a comparison circuit section of an analog to digital converter according to the present invention.

FIG. 8 is a circuit diagram showing a fifth embodiment of a comparison circuit section of an analog to digital converter according to the present invention where it is applied to an analog to digital converter of the parallel comparison type.

Referring to FIG. 8, when it is tried to convert an analog input voltage $V_{IN}$ applied to an analog input terminal 84 into a digital signal of, for example, 8 bits, 255 comparators COP1A, COP2A, COP3A, COP4A, ... are provided.

All of the comparators COP1A, COP2A, COP3A, COP4A, ... have a same circuit construction. For example, in the comparator COP1A, an emitter follower stage 71 on the analog input side is constituted from an NPN transistor Q61 and a constant-current source Il1 connected in series between a GND line and a $V_{EE}$ line, and similarly, an emitter follower on the reference voltage side is constituted from an NPN transistor Q62 and a constant-current source Il2.

In the emitter follower stage 71 on the analog input side, the analog input voltage $V_{IN}$ is applied to the base of the transistor 61 by way of an analog signal line 81. Meanwhile, since the bases of the transistors Q61, Q71, Q76, Q81, ... of the 255 comparators COP1A, COP2A, COP3A, COP4A, ... have an equal potential and consequently the emitters naturally have an equal potential, the emitters are connected in common by way of a signal line 82.

Meanwhile, a reference $V_{REF1}$ is applied from a reference voltage generation circuit 83 to the base of the transistor Q62 of the emitter follower stage 72 on the reference voltage input side.

The reference voltage generation circuit 83 is constituted from 256 resistors $r_{1A}$ to $r_{255A}$ connected in series between the $V_{RT}$ and $V_{RB}$ lines corresponding to a digital signal of 8 bits, and generates reference voltages $V_{REF1}$, $V_{REF2}$, ... of different voltage values, which make comparison voltages for the comparators COP1A, COP2A, ..., at 255 junctions between adjacent ones of the resistors by potential division of the registers.

The differential amplifier 73 includes a pair of differential transistors Q63 and Q64 whose emitters are connected in common, a pair of resistors R71 and R72 connected between the collectors of the differential transistors Q63 and Q64 and the GND line, respectively, and a constant-current source I13 connected between a common junction between the emitters of the differential transistors Q63 and Q64 and the $V_{EE}$ line, and receives a pair of inputs of the analog input voltage $V_{IN}$ and the reference voltage $V_{REF1}$.

In the differential amplifier 73, the emitter of the transistor Q61 of the emitter follower 71 on the analog input side is connected to the base of the transistor Q63, and the emitter of the transistor Q62 of the emitter follower stage 72 on the reference voltage input side is connected to the base of the other transistor Q64.

In actual operation of the analog to digital converter of the parallel comparison type having the construction described above, in whatever manner the analog input voltage $V_{IN}$ varies, the differential amplifier 73 of only one of the 255 comparators COP1A, COP2A, COP3A, COP4A, . . . makes a switching operation at an instant.

Accordingly, since the output terminals of the emitter follower stages 71 on the analog input side, that is, the emitters of the transistors Q61, Q71, Q76, Q81, . . . , are connected in common between adjacent ones of the 255 comparators COP1A, COP2A, COP3A, COP4A, . . . , the 255 emitter follower stages 71 take charge of one differential amplifier. Since this is equivalent to the fact that the current of one of the emitter follower stages which corresponds to the differential amplifier which makes a switching operation, the influence of kickback noise from the differential amplifier can be reduced without increasing the current consumption.

Here, generally speaking, where the number of transistors connected to the signal line 82 is represented by n, the dynamic load to each emitter follower stage is reduced to 1/n in principle.

Actually, however, when the analog input voltage $V_{IN}$ varies quickly, several differential amplifiers make switching operations with little time differences, and accordingly, the substantial dynamic load is a little higher.

Figure 9:
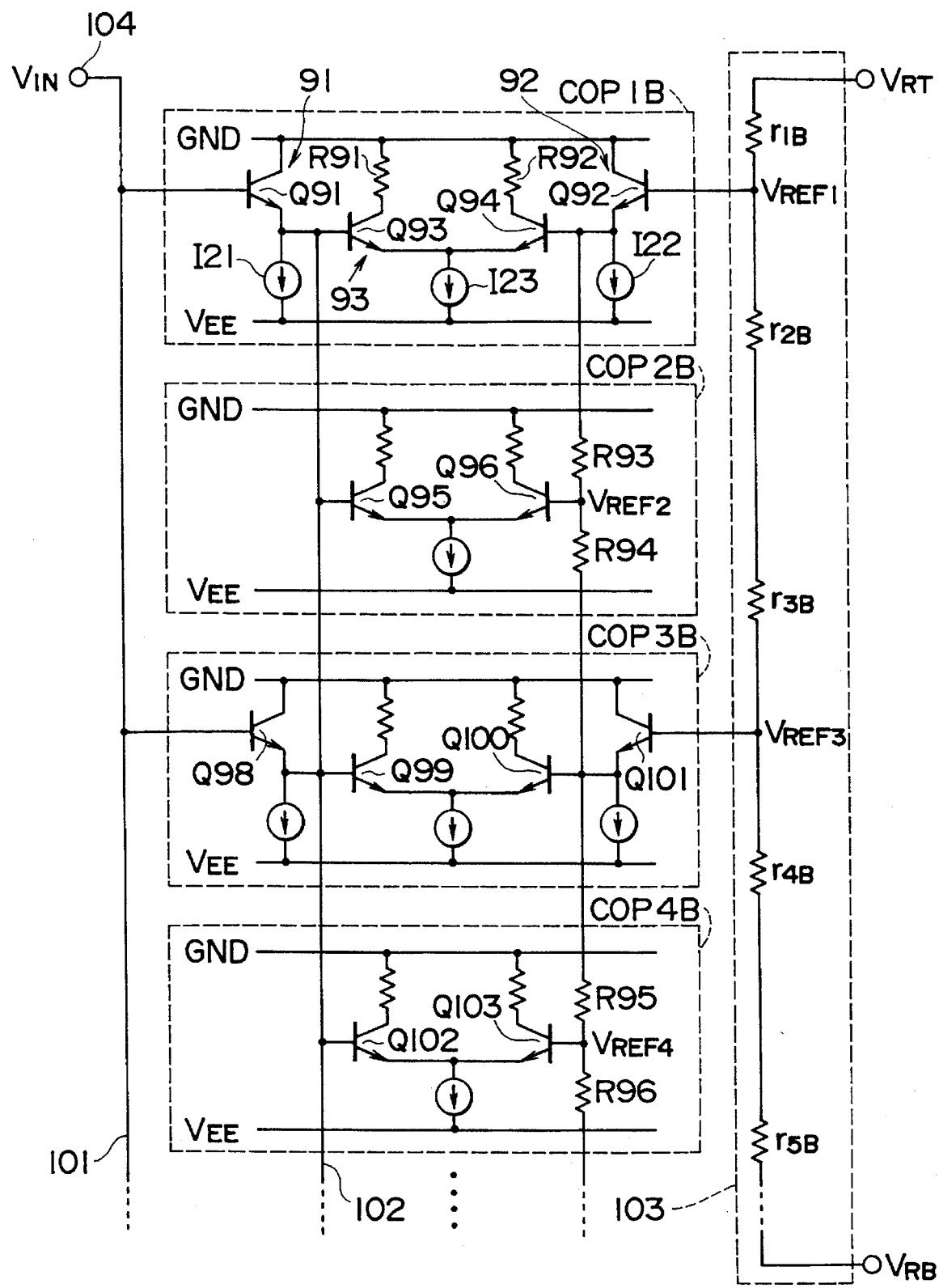
FIG. 9 is a circuit diagram showing a sixth embodiment of a comparison circuit section of an analog to digital converter according to the present invention.

FIG. 9 is a circuit diagram showing a sixth embodiment of the present invention. In the present embodiment, the construction is such that the number of emitter follower stages 91 on the analog input side is reduced to one half and also the number of emitter follower stages 92 on the reference voltage side is reduced to one half comparing with those of the fifth embodiment which is constructed for 8 bits.

In the present embodiment, the emitter follower stages 91 of, for example, even-numbered comparators COP2B, COP4B, . . . are omitted.

By reducing the number of the emitter follower stages 91 to one half that of the fifth embodiment in this manner, also the emitter follower stages 91 which take charge of one differential amplifier is reduced to one half. Accordingly, while the effect in reduction of the influence of kickback noise from the differential amplifier is a little lower than that of the fifth embodiment, since the analog input capacitance can be reduced as the transistor capacitance of the emitter follower stage 91 decreases, a higher conversion rate can be achieved.

In the analog to digital converter of the present invention, since the number of emitter follower stages on the analog input side is made smaller than the number of differential amplifiers, the capacitance of the transistors at the emitter follower stages can be reduced comparing with that where the number of emitter follower stages are equal to the number of differential amplifiers. Further, since also the analog input capacitance can be reduced by such reduction of the transistor capacitance, the input frequency upon analog to digital conversion can be further increased.

As an example, in the construction for 8 bits, since the transistor capacitance occupies approximately one third of the analog input capacitance, the analog input capacitance can be reduced to approximately one sixth by reducing the transistor capacitance to one half.

On the other hand, as regards the emitter follower stages 92 on the reference voltage input side, the number of them is reduced corresponding to the emitter follower stages 91 on the analog input side. To this end, reference voltages are applied to differential amplifiers of the even-numbered comparators COP2B, COP4B, . . . by dividing the potential differences between the reference voltages applied to the odd-numbered comparators COP2B, COP4B, . . . .

For example, in the second comparator COP2B, a pair of voltage dividing resistors R93 and R94 are connected in series between the emitter of the transistor Q92 of the first comparator COP1B and the emitter of the transistor Q101 of the third comparator COP3B and a junction between the voltage dividing resistors R93 and R94 is connected to the base of the transistor Q96 of the differential transistor pair to provide the reference voltage $V_{REF2}$.

By setting the numbers of the emitter follower stages 91 and the emitter follower stages 92 equal to each other in this manner, transistors of the same size can be employed between the analog input side and the reference voltage side, and accordingly, the temperature variation has no influence.

In contrast, where the numbers of the emitter follower stages 91 and the emitter follower stages 92 are different, transistors of different sizes are employed between the analog input side and the reference voltage side. Where transistors of different sizes are employed, the temperature characteristic of the base-emitter voltage $V_{BE}$ is different between the transistors. Consequently, a temperature variation provides an apparent variation in actual value of the analog input voltage $V_{IN}$, and accordingly, accurate analog to digital conversion cannot be performed.

It is to be noted that, while the numbers of the emitter follower stages 91 and the emitter follower stages 92 are set equal to each other in the sixth embodiment, if the circuit construction wherein the variation of the base-emitter voltage $V_{BE}$ caused by a temperature variation can be corrected is adopted, the numbers of the emitter follower stages 91 and the emitter follower stages 92 need not necessarily be set equal to each other.

Figure 10:
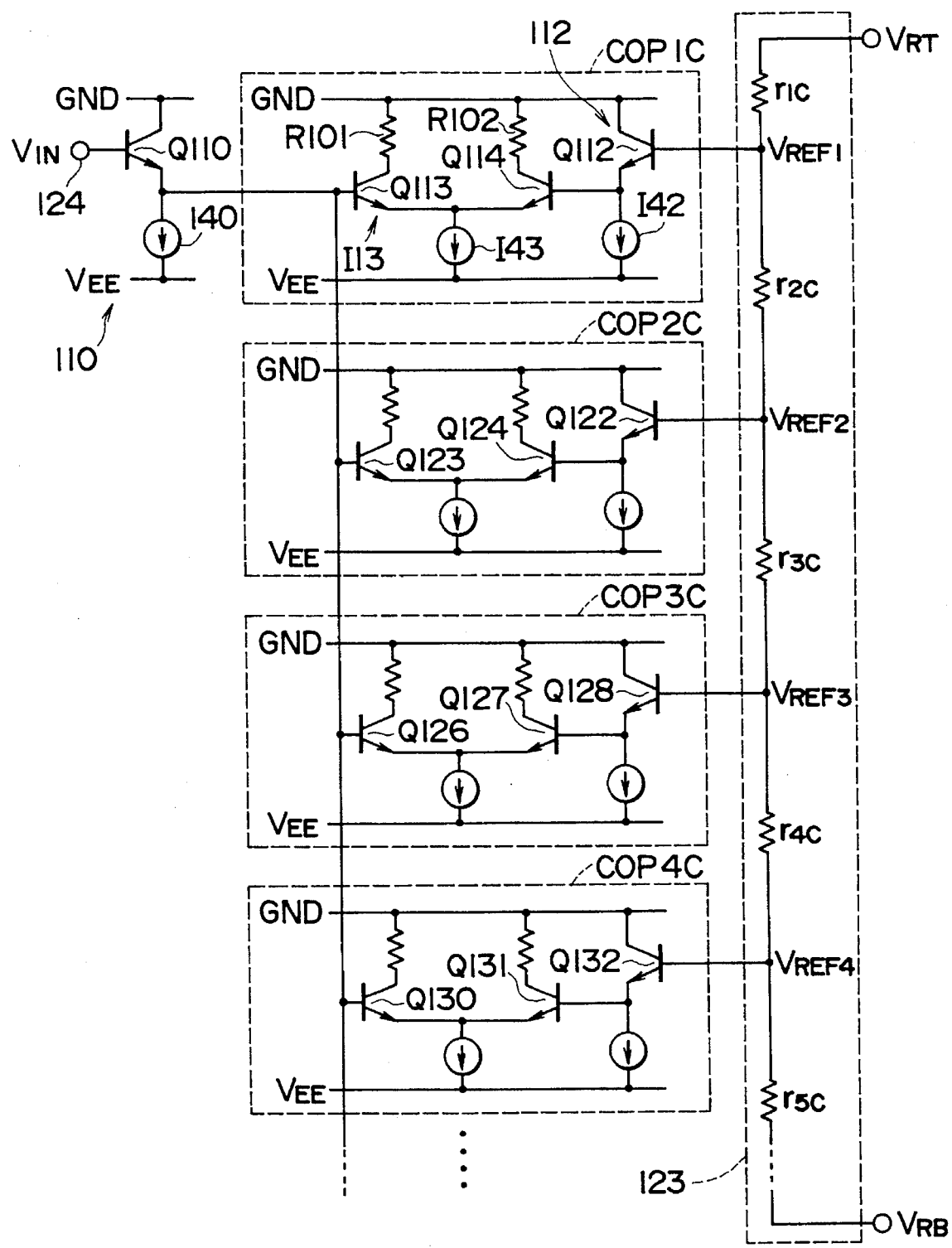
FIG. 10 is a circuit diagram showing a seventh embodiment of a comparison circuit section of an analog to digital converter according to the present invention.

FIG. 10 is a circuit diagram showing a seventh embodiment of the present invention.

In the present embodiment, the construction is such that one emitter follower stage 110 on the analog input side is provided common to differential amplifiers 113 of 255 comparators COP1C, COP2C, COP3C, COP4C, . . . and they are disposed in the proximity of an analog input terminal 124 in layout.

With the present construction, since the number of emitter follower stages is further smaller than that of the fifth embodiment, the transistor capacitance of the emitter follower stages is further reduced and also the wiring capacitance parasitic in the analog input line 101 (FIG. 9) is reduced remarkably. Consequently, since the analog input capacitance having a significant influence on the input frequency upon analog to digital conversion can be further reduced, a further higher input frequency can be achieved.

It is to be noted that, while the present embodiment is constructed such that the emitter follower stages 110 on the analog input side are provided common to the differential amplifiers 113 of the 255 comparators COP1C, COP2C, COP3C, COP4C, . . . and are disposed in the proximity of the analog input terminal 124 in layout, all of the emitter follower stages of the 255 comparators COP1C, COP2C, COP3C, COP4C, . . . in the fifth embodiment may be disposed collectively in the proximity of the analog input terminal 84 (104, 124) in layout.

In this instance, while the effect involved in reduction of the transistor capacitance cannot be anticipated, since the wiring capacitance parasitic in the analog input line 81 (101) can be reduced, the effect by the analog input capacitance involved in reduction of the wiring capacitance can be anticipated.

Further, it is apparent from the description of the sixth embodiment that the transistor capacitance can be reduced to reduce the analog input capacitance by reducing the number of emitter follower stages arranged collectively in the proximity of the analog input terminal 124 in layout, the construction of the third embodiment can most exhibit the effects involved in reduction of the transistor capacitance and reduction of the wiring capacitance.

It is to be noted that, while, in the fifth to seventh embodiments described above, the case wherein the present invention is applied to an analog to digital converter of the parallel comparison type which is constructed such that one of the comparison voltages which coincides with the analog input terminal $V_{IN}$ is determined collectively is described, the present invention is not limited to this and can be similarly applied to an analog to digital converter of the serial-parallel comparison type of the construction wherein two or more constructions for parallel comparison are combined to perform comparison with the analog input voltage $V_{IN}$ at two or more stages.

As described so far, according to the present invention, the following effects can be achieved.

In particular, in the analog to digital converter, since it includes a plurality of comparators which compare an analog input voltage with a plurality of comparison voltages as reference voltages having different voltage values and output terminals of emitter follower stages on the analog input side are connected in common between adjacent ones of the plurality of comparators, the plurality of emitter follower stages take charge of a single differential amplifier, and this is equivalent to the construction wherein the current of an emitter follower stage corresponding to a differential amplifier which performs a switching operation is increased. Consequently, the influence of kickback noise from the differential amplifier can be reduced without increasing the number of elements or the power dissipation of the circuit.

Figure 11:
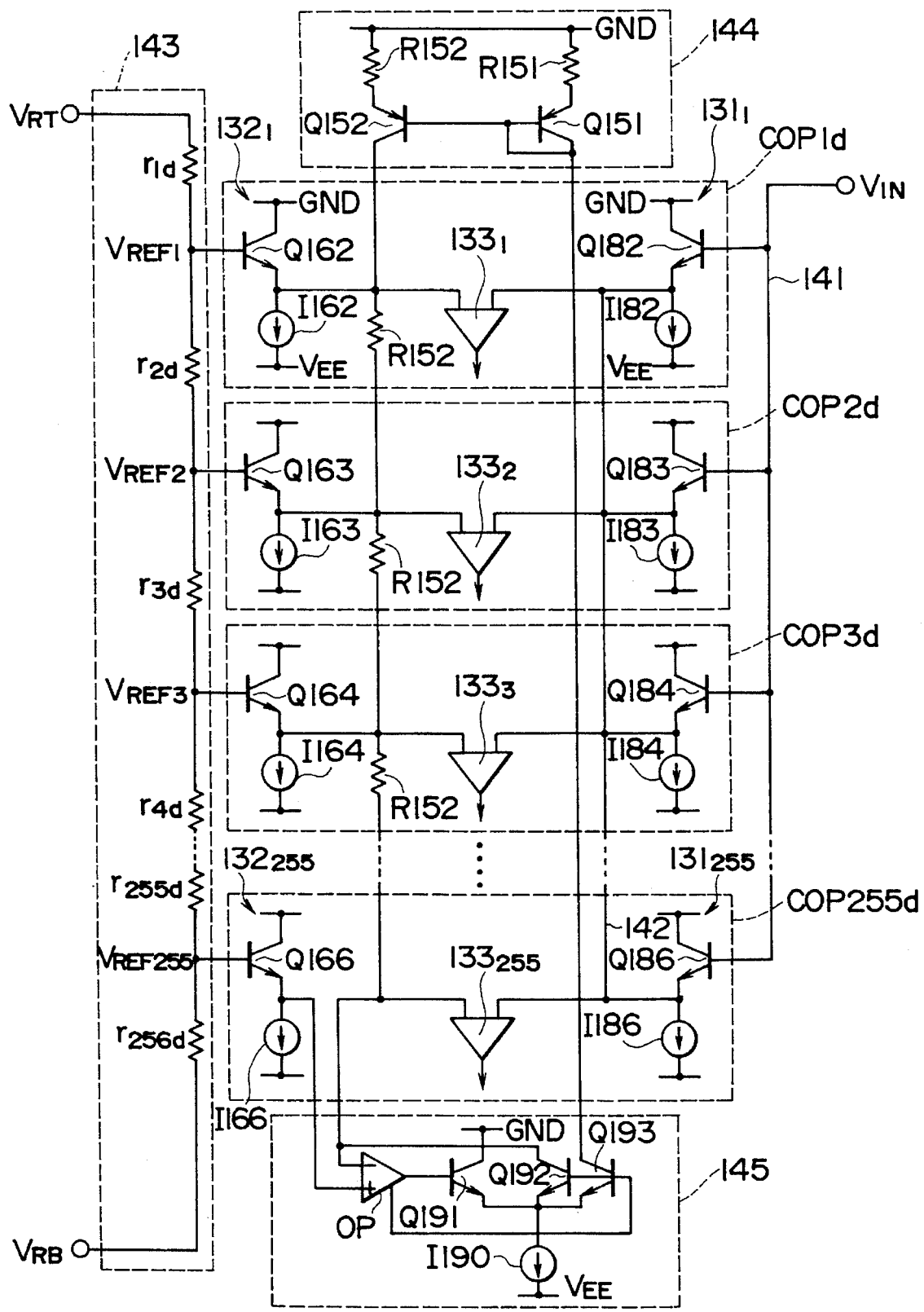
FIG. 11 is a circuit diagram of a comparison circuit showing an eighth embodiment of the present invention.

FIG. 11 is a circuit diagram showing a comparison circuit for an analog to digital converter showing an eighth embodiment of the present invention wherein it is applied to an analog to digital converter of the parallel comparison type.

Referring to FIG. 11, if the case wherein an analog input voltage $V_{IN}$ is converted into a digital signal of 8 bits is taken as an example, 255 comparators COP1$d$ to COP255$d$ are provided for the analog input voltage $V_{IN}$.

All of the comparators COP1$d$ to COP255$d$ have a same circuit construction. For example, in the comparator COP1$d$, an emitter follower stage 182 on the analog input side is constituted from an NPN transistor Q182 and a constant-current source I182 connected in series between a GND line and a $V_{EE}$ (negative voltage) power source line, and similarly, an emitter follower stage $132_1$ on the reference voltage side is constituted from an NPN transistor Q162 and a constant-current source I162.

In the emitter follower stages $131_1$ to $131_{255}$ on the analog input side, the analog input voltage $V_{IN}$ is applied to the bases of the transistors Q182 to Q186 by way of an analog signal line 141. Meanwhile, since the potentials at the bases of the transistors Q182 to Q186 are equal among the 255 comparators COP1$d$ to COP255$d$ and also the potentials at the emitters of them are originally equal, the emitters are in connected common by way of a signal line 142.

Meanwhile, reference voltages $V_{REF1}$ to $V_{REF255}$ are applied from a reference voltage generation circuit 143 to the bases of the transistors Q162 to Q166 of the emitter follower stages $132_1$ to $132_{255}$ on the reference voltage input side. Meanwhile, the emitters of the transistors Q162 to Q166 are connected by way of a resistor R between each adjacent ones of the 255 comparators COP1$d$ to COP255$d$.

The reference voltage generation circuit 143 is constituted from 256 resistors $r_{1d}$ to $r_{256d}$ connected in series between $V_{RT}$ and $V_{RB}$ lines corresponding to a digital signal of 8 bits, and generates the reference voltages $V_{REF1}$ to $V_{REF255}$ having different voltage values and making comparison voltages for the comparators COP1$d$ to COP255$d$, respectively, at 255 nodes between the resistors by potential division of the resistors.

The analog input voltage $V_{IN}$ having passed through the emitter follower stages $131_1$ to $131_{255}$ on the analog input side is compared by the differential amplifiers $133_1$ to $133_{255}$ with the reference voltages $V_{REF1}$ to $V_{REF255}$ inputted to them by way of the emitter follower stages $132_1$ to $132_{255}$ on the reference voltage side, respectively.

In actual operation of the analog to digital converter of the parallel comparison type of the construction described above, in whatever manner the analog input voltage $V_{IN}$ varies, the differential amplifier 133 of only one of the 255 comparators COP1$d$ to COP255$d$ makes a switching operation at a certain instant.

Accordingly, since the output terminals of the emitter followers $131_1$ to $131_{255}$ on the analog input side, that is, the emitters of the transistors Q182 to Q183, are connected in common between adjacent ones of the comparators COP1$d$ to COP255$d$, the 255 emitter followers $131_1$ to $131_{255}$ take charge of the one differential amplifier 133, and this is substantially equivalent to the fact that the current of the emitter follower stage 131 corresponding to the differential amplifier 133 which makes an switching operation is increased.

Consequently, the influence of kickback noise from the differential amplifiers $133_1$ to $133_{255}$ can be reduced without increasing the current dissipation.

The kickback noise is produced by the fact that, upon switching of the differential amplifiers $133_1$ to $133_{255}$, high currents flow through the bases of differential transistor pairs constituting the differential amplifiers and such current variations have a significant influence upon the emitter currents of the transistors Q182 to Q186 of the emitter follower stages $131_1$ to $131_{255}$, and makes a factor of deteriorating the conversion accuracy upon analog to digital conversion.

Accordingly, improvement in conversion accuracy in analog to digital conversion can be achieved by reducing the influence of kickback noise from the differential amplifiers $133_1$ to $131_{255}$.

Meanwhile, since the output terminals of the emitter follower stages $132_1$ to $132_{255}$, that is, the emitters of the transistors Q162 to Q166, are connected by way of the resistor R between each adjacent ones of the comparators COP1$d$ to COP255$d$, the base-emitter voltages $\Delta V_{BE}$ are compensated for by each other between adjacent ones of the emitter follower stages $132_1$ to $132_{255}$ on the reference voltage side. Accordingly, since the base-emitter voltages $\Delta V_{BE}$ can be reduced without increasing the transistor size as in the prior art, the differential linear distortion can be reduced without increasing the input capacitance. The principle will be described below.

Figure 12:
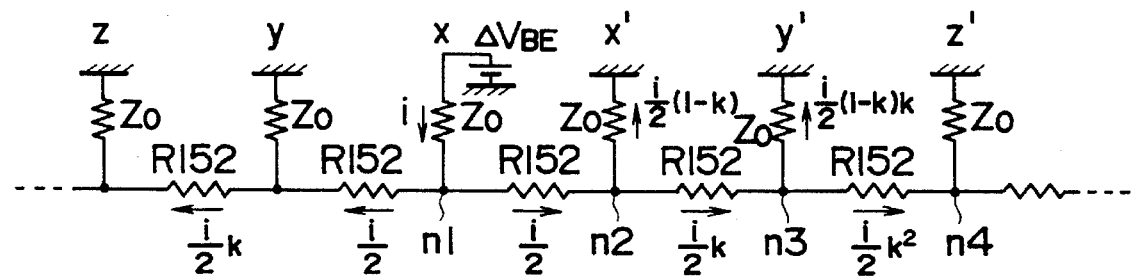
FIG. 12 is an equivalent circuit diagram for explaining the principle of the present invention of the comparison circuit shown in FIG. 11.

Now, a model wherein each emitter follower stage 132 on the reference voltage side has an output resistance Z and additional resistors R152 are provided between adjacent ones of the emitter follower stages 132 such that the emitter follower stages 132 and the additional resistors R152 appear repetitively and infinitely in the leftward and rightward directions like a ladder. An equivalent circuit to the model is shown in FIG. 12.

It is assumed that a current i produced by the base-emitter voltage $\Delta V_{BE}$ appearing at a certain node, for example, at the output terminal of one of the emitter follower stages $132_1$ to $132_{255}$, is divided into two ½ currents since the resistance values on the left and the right of the node n1 are equal and is further divided at the ratio k:(1-k) between the additional resistor R152 side and the output resistance Z0 side at the node n2. From the symmetry of repetition, the ratio has an equal value also at all of the nodes n3, n4, . . . . Therefore, the voltage at the node n2 is given by the following expression:

$$\frac{i}{2}(1-k)Z_0 = \frac{i}{2}kR152 + \frac{i}{2}(1-k)kZ_0 \quad (4)$$

By rearranging the expression, $$Z_0 k^2 - (2Z_0 + R152)k + Z_0 = 0 \quad (5)$$

From the expression, the coefficient k can be calculated as $$k = \frac{1 + q - \sqrt{1+2q}}{q} \quad (6)$$

where $q = 2Z_0/R152$. Here, the negative sign is employed since k<1.

Subsequently, from $$\Delta V_{BE} = Z_0 i + R152 \cdot \frac{i}{2} + Z_0 \cdot \frac{i}{2}(1-k) \quad (7)$$

the following expression is obtained:

$$\frac{\Delta V_{BE}}{i} = Z_0 + \frac{R152}{2} + \frac{Z_0}{2} \cdot \frac{-R152 + \sqrt{R^2 + 4Z_0 R152}}{2Z_0} \quad (8)$$

$$= Z_0 + \frac{R152 + \sqrt{R152^2 + 4Z_0 R152}}{4}$$

Therefore, the ratio between the voltage between the nodes n1 and n2 and the base-emitter voltage $\Delta V_{BE}$ is given by $$\frac{(i/2)R152}{\Delta V_{BE}} = \frac{R152/2}{\Delta V_{BE}/i} = \quad (9)$$

$$= \frac{2R152}{4Z_0 + R152 + \sqrt{R152^2 + 4Z_0 R152}}$$

$$= \frac{2}{1 + 2q + \sqrt{1+2q}}$$

In order to calculate a differential linear distortion (DLE), it is necessary to square and add the contributions of all of the nodes and then extract the square root of the sum. The weights at the points x and x' in FIG. 12 are equal, and the magnitudes of them can be calculated from the expression (9) above. Since the points y and y' have an effect of $k^2$ times; the points z and z' have another effect of $k^4$ times; . . . , $$(DLE/\Delta V_{BE})^2 = 2a^2(1 + k^2 + k^4 + k^8 + \ldots) \quad (10)$$

$$= \frac{2a^2}{1 - k^2}$$

where the coefficient a is given by the expression (9) above. By substituting the expression of k into the expression (10) above and rearranging it, $$\left(\frac{DLE}{\Delta V_{BE}}\right)^2 = \quad (11)$$

$$\frac{4q^2}{\left((1+2q) + \sqrt{1+2q}\right)^2 \left(-(1+2q) + (1+q)\sqrt{1+2q}\right)}$$

Where no additional resistance R152 is involved, $(DLE/\Delta V_{BE})^2 = 2$, and accordingly, the inhibition coefficient r is calculated, by extracting the square root of the ratio, by the following expression:

$$r = \frac{\sqrt{2} \cdot q}{\left((1+2q) + \sqrt{1+2q}\right)\sqrt{-(1+2q) + (1+q)\sqrt{1+2q}}} \quad (12)$$

The expression indicates a monotone decrease where q>0.

Figure 13:
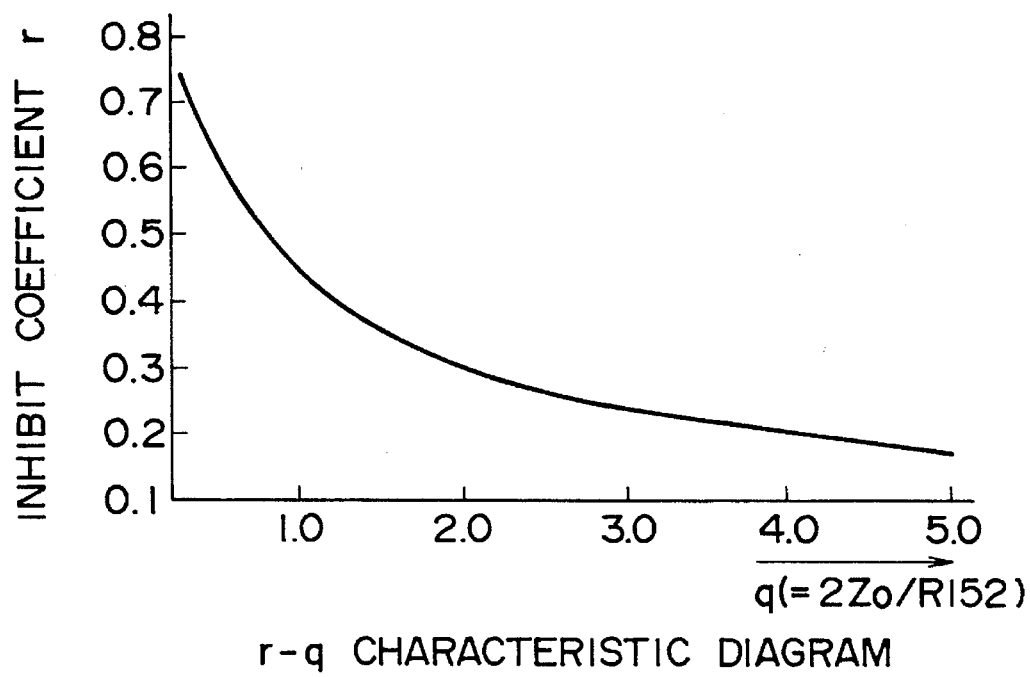
FIG. 13 is an r-q characteristic diagram illustrating an effect of improvement in differential linear distortion by an additional resistor.

The r-q characteristic which represents the improvement effect of the differential linear distortion by the resistors R152 additionally connected between adjacent ones of the emitter follower stages $132_1$ to $132_{255}$ on the reference voltage side is illustrated in FIG. 13.

By the way, a current flows through each of the additionally connected resistors R152. Since the current flowing into an emitter follower stage 132 on the reference voltage side and the current flowing out of the emitter follower stage 132 are equal at or around a middle point between reference potentials, the current of the emitter follower stage 132 is invariable.

However, a current only flows out in the uppermost emitter follower stage $132_1$, but on the contrary a current only flows in in the lowermost emitter follower stage $132_{255}$. In order to ignore the base-emitter voltage $\Delta V_{BE}$ originating from the flowing out current or the flowing in current, the emitter follower current must necessarily be increased to such a high value as does not really appear.

Here, the emitter follower current $I_{EF}$ sufficient to allow the current flowing through a resistor R152 to be ignored will be examined.

When the case of a 10-bit analog to digital converter with a full scale of 2 V is taken as an example, if 1 LSB=2 mV and R152=1 kΩ, then the current flowing through the resistor R152 is 2 μA. If it is assumed that the base-emitter voltage $\Delta V_{BE}$ at the current of 2 μA is $\Delta V_{BE}$=0.1 LSB=0.2 mV, then since the expression $$0.2mV = V_T \ln(I_{EF} + 2\mu A)/I_{EF}$$

stands, if $V_T$=26 mA, then $I_{EF}$=259 μA, which is a considerably high current.

In a 10-bit analog to digital converter, such emitter follower is employed by a total number of about 2,000 on the reference voltage side and the analog input side, and consequently, the total emitter follower current is approximately 0.5 A (≈259 μA×2,000).

Thus, the present embodiment is constructed such that, as current correction circuits, a current supplementing circuit 144 is provided on the uppermost side and a current flowing out circuit 145 is provided on the lowermost side such that a current has a value equal to that of the current flowing through each additional resistor R152 is flowed out from the lowermost emitter follower stage $132_{255}$ by the current flowing out circuit 145 while a current of the equal value is supplemented to the uppermost emitter follower stage $132_1$ by the current supplementing circuit 144.

The current supplementing circuit 144 has such a current mirror construction as shown in FIG. 11 wherein it includes a PNP transistor Q151 connected in a diode connection, another PNP transistor Q152 whose base is connected common to the base of the transistor Q151, and a pair of resistors R151 and R152 connected between the emitters of the transistors Q151 and Q152 and the GND line.

Meanwhile, the current flowing out circuit 145 includes an operational amplifier OP having a positive phase (+) input terminal to which a current of the lowermost emitter follower stage $132_{255}$ is inputted and a reverse phase (−) input terminal to which a current flowing through an additional resistor R152 is inputted, an NPN transistor Q191 whose base is connected to an output terminal of the operational amplifier OP and whose collector is connected to the GND line, another NPN transistor Q192 whose emitter is connected common to the emitter of the transistor Q191 and whose collector is connected to the reverse phase input terminal of the operational amplifier, a further NPN transistor Q193 whose emitter and base are connected common to the emitter and the base of the NPN transistor Q192 to constitute a current mirror circuit, and a current source $I_{190}$ connected between a common junction between the emitters of the transistors Q191 to Q193 and the $V_{EE}$ power source line.

The collector of the transistor Q193 is connected to a common junction between the collector and the base of the transistor Q151 of the current supplementing circuit 144.

In the current flowing out circuit 145, a negative feedback circuit is constituted from the operational amplifier OP and the transistors Q191 and Q192, and by an action of the operational amplifier OP, a current flowing through the additional resistor R152 all flows into the transistor Q192.

Since the transistor Q192 and the transistor Q193 constitute a current mirror circuit, a current of an equal value to that of the collector current of the transistor Q152 flows into the collector of the transistor Q193.

The collector current is returned by the current mirror circuit of the transistors Q151 and Q152 constituting the current supplementing circuit 144 so that it flows into the output terminal of the uppermost emitter follower stage $132_1$.

Since a current of an equal value to that of the current flowing through the additional resistor R152 is flowed out from the lowermost emitter follower stage $133_{255}$ by the current flowing out circuit 145 while a current of the equal value is supplemented into the uppermost emitter follower stage $132_1$ by the current supplementing circuit 144, the base-emitter voltage $\Delta V_{BE}$ between the emitter follower stages 132 caused by a current flowing out from the uppermost emitter follower stage $132_1$ and a current flowing into the lowermost emitter follower stage $132_{255}$ can be ignored.

Subsequently, a ninth embodiment of the present invention will be described.

Figure 14:
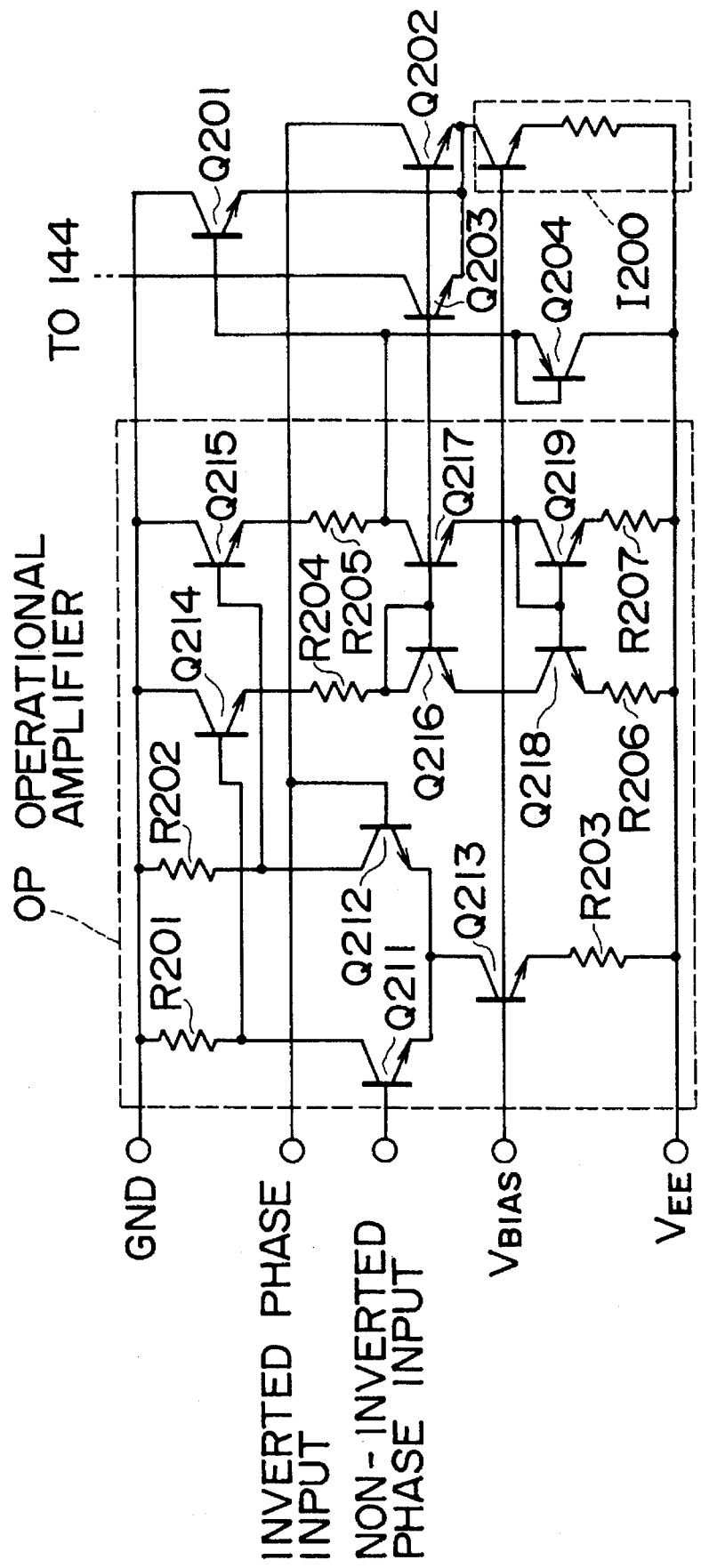
FIG. 14 is a circuit diagram showing an example of the detailed circuit construction of a current flowing out circuit which is a eighth embodiment of the present invention.

FIG. 14 is a circuit diagram showing an example of the detailed circuit construction of the current flowing out circuit 145.

Referring to FIG. 14, a differential amplifier is constituted from a pair of differential transistors Q211 and Q212 whose emitters are connected common, a pair of resistors R201 and R202 connected between the collectors of the differential transistors Q211 and Q212 and the GND line, respectively, and a transistor Q213 and a resistor R203 connected in series between a common junction between the emitters of the differential transistors Q211 and Q212 and the $V_{EE}$ power source line.

Two outputs of the differential amplifier, that is, the collector outputs of the transistors Q211 and Q212, are led out by way of a pair of transistors Q214 and Q215 of an emitter follower, respectively.

The collectors of the transistors Q214 and Q215 of the emitter follower are connected to the GND line, and the collectors of a pair of transistors Q216 and Q217 of a current mirror construction are connected to the emitters of the transistors Q214 and Q215 by way of a pair of resistors R204 and R205, respectively.

The collectors of a pair of transistors Q218 and Q219 of a current mirror construction are connected to the emitters of the transistors Q216 and Q217, respectively. The emitters of the transistors Q218 and Q219 are connected to the $V_{EE}$ power source line by way of a pair of resistors R206 and R207, respectively.

The operational amplifier OP of the current flowing out circuit 145 of FIG. 11 is constituted from the components described above. The other transistors Q201 to Q203 have the same circuit construction as that in FIG. 11.

Meanwhile, a PNP transistor Q204 connected between the base of the transistor Q201 and the $V_{EE}$ power source is provided in order to prevent oscillation.

It is to be noted that, while, in the embodiment described above, the present invention is applied to an analog to digital converter of the parallel comparison type of the construction wherein comparison voltages are collectively determined to find out a comparison voltage which is equal to the analog input voltage $V_{IN}$, the present invention is not limited to this and can be similarly applied to another analog to digital converter of the serial-and-parallel comparison type of the construction wherein the construction for parallel comparison is combined by two or more stages to effect comparison with the analog input voltage $V_{IN}$ at two or more stages.

As described so far, according to the present invention, since output terminals of emitter follower stages on the reference voltage side are connected by way of a resistor between each adjacent ones of a plurality of comparators, the base-emitter voltage can be reduced without reducing the transistor size due to the fact that the voltages $\Delta V_{BE}$ of adjacent ones of the emitter follower stages on the reference voltage side are compensated for by each other, and accordingly, the differential linear distortion can be reduced without increasing the input capacitance.

Further, since a current of an equal value to that of a current flowing through a resistor which connects the output terminal of the second emitter follower stage is flowed out from the lowermost second emitter follower stage while a current of the equal value is supplemented to the uppermost second emitter follower stage, the base-emitter voltages $\Delta V_{BE}$ between the second emitter follower stages caused by a current flowing into the lowermost second emitter follower stage and another current flowing out from the uppermost second emitter follower stage can be ignored.

Figure 15:
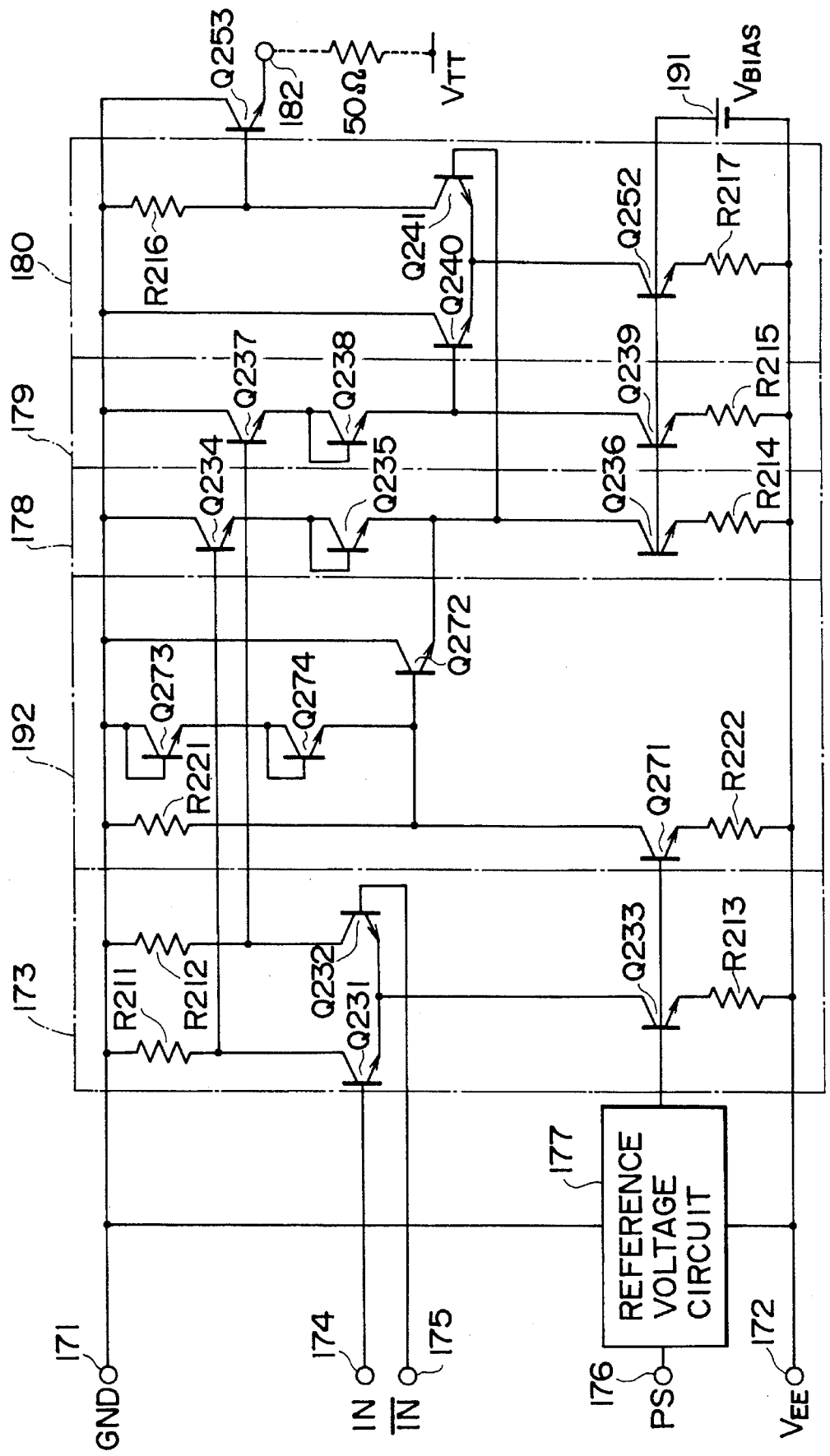
FIG. 15 is a detailed circuit construction view of an ECL circuit which is a ninth embodiment of the present invention.

Subsequently, FIG. 15 is a circuit diagram showing a tenth embodiment of an ECL circuit according to the present invention.

Referring to FIG. 15, a differential amplifier 173 at the input stage includes a pair of differential transistors Q231 and Q232 whose emitters are connected common to perform a differentiation operation, a pair of resistors R211 and R212 connected between the collectors of the differential transistors Q231 and Q232 and a GND (first power source) terminal 171, and a transistor Q233 and a resistor R213 connected in series between a common junction between the emitters of the differential transistors Q231 and Q232 and a $V_{EE}$ power source (second power source) terminal 172.

In the differential amplifier 173, the bases of the differential transistors Q231 and Q232 are connected to a pair of input terminals 174 and 175, respectively.

In power saving (PS) operation, a PS signal is supplied to a reference voltage circuit 177 by way of a control terminal 176. The reference voltage circuit 177 provides, when no power saving operation is to be performed, a predetermined reference voltage to the base of the transistor Q233 to turn the transistor Q233 into an on-state, but turns the transistor Q233 into an off-state in response to the PS signal when a power saving operation is to be performed.

A pair of outputs of the differential amplifier 233 are supplied to a differential amplifier 180 at the last stage by way of emitter follower circuits 178 and 179.

The emitter follower circuit 178 includes a transistor Q234 whose collector is connected to the GND terminal 171 and to whose base one of the two outputs of the differential amplifier 173 is inputted, another transistor Q235 connected in a diode connection with the collector and the base thereof connected common to the emitter of the transistor Q234, and a further transistor Q236 and a resistor R214 connected in series between the emitter of the transistor Q235 and the $V_{EE}$ power source terminal 172.

Also the emitter follower circuit 179 similarly includes a transistor Q237, another transistor Q238 connected in a diode connection, and a further transistor Q239 and a resistor R215.

A fixed bias voltage $V_{BIAS}$ of, for example, 1.3 V is applied from a fixed voltage source 191 to the bases of the transistors Q236 and Q239.

A differential amplifier 180 at the last stage includes a pair of differential transistors Q240 and Q241 whose emitters are connected common to perform a differential operation, a resistor R216 connected between the collector of the transistor Q241 and the GND terminal 171, and a transistor Q252 and a resistor R217 connected in series between a common junction between the emitters of the differential transistors Q240 and Q241 and the $V_{EE}$ power source terminal 172.

The fixed bias voltage $V_{BIAS}$ of 1.3 V is applied from the fixed voltage source 191 also to the base of the transistor Q252.

By the way, since the output amplitude of the differential amplifier 180 at the last stage is determined approximately to 0.8 V by the specifications of the ECL, in order to avoid saturation of the transistor Q241, where the base-emitter voltage of a transistor is represented by $V_{BE}$, the base input must be lower than the GND level by a potential difference greater than $2V_{BE}$. In order to realize this, the transistors Q235 and Q238 connected in a diode connection are provided for the emitter follower circuits 178 and 179, respectively.

It is to be noted that the transistors Q235 and Q236 may be replaced by a common diode disposed on the GND side of the resistors R211 and R212 of the differential amplifier 173.

The collector output of the transistor Q241 is led out from the output terminal 182 by way of the output transistor Q253.

A control circuit 192 is provided for fix the output level of the output transistor Q253 to a low level when a power saving operation is performed.

The control circuit 192 includes a resistor R221 having a terminal connected to the GND terminal 171, a transistor Q271 and a resistor R222 connected in series between the other terminal of the resistor R221 and the VEE voltage source 172, a control transistor Q272 whose base is connected to the other terminal of the resistor R221 and whose emitter is connected to the base of the transistor Q241 of the differential amplifier 180, and a pair of transistors Q273 and Q274 connected in a diode connection and in series between the GND terminal 171 and the base of the control transistor Q272.

In the control circuit 192, the transistor Q271 and the resistor R222 constitute a current source which is put into an active condition when a power saving operation is not performed as the predetermined reference voltage is applied from the reference voltage circuit 177 to the base of the transistor Q271, but is put into an inactive condition when a power saving operation is performed.

The transistors Q273 and Q274 connected in a diode connection constitute a limiter which prevents saturation of the transistor Q271 even when the reference voltage of the reference voltage circuit 177 becomes excessively high. The limiter is provided when necessary, but is not essential.

The control transistor Q272 is connected common at the emitter thereof to the emitter of the transistor Q235 to construct a wired OR circuit.

In the ECL output circuit according to the present invention of the construction described above, constants of the components of the same are set such that, when a power saving operation is not performed, a voltage higher than $(R211 \cdot I_{C20} + V_{BE})$ is generated across the resistor R221 of the control circuit 192. Here, $I_{C20}$ is the collector current of the transistor Q233. It is to be noted that, taking a fluctuation of the reference voltage of the reference voltage circuit 177 into consideration, a somewhat higher voltage is preferably generated across the resistor R221.

Subsequently, operation of the circuit will be described. First, when a power saving operation is not performed, since a higher voltage than $(R211 \cdot I_{C20} + V_{BE})$ is generated across the resistor R221, the control transistor Q272 remains in an off-state. Accordingly, the control circuit 192 does not act upon the output transistor Q253 at all.

When a power saving operation is to be performed, since the transistor Q233 of the differential amplifier 173 and the transistor Q271 of the control circuit 192 are both turned off, the voltages across the resistors R211 and R212 of the differential amplifier 173 and the resistor R221 of the control circuit 192 are reduced approximately to 0 V.

Consequently, the emitter of the control transistor Q272 presents the potential of $-V_{BE}$ and the emitter of the transistor Q238 presents the potential of $-2V_{BE}$. As a result, the transistor Q241 of the differential amplifier 180 is put into an on-state. As a result, a current flows through the resistor R216, and the output level of the output transistor Q253 is changed to a low level.

As described above, when the ECL output circuit having a power saving function uses its power saving function, the output level of the output transistor Q253 is fixed to a low level by the control circuit 192, and consequently, the current consumption at the output terminal end upon power saving operation can be reduced.

As an example, even if the currents flowing through the transistors Q236, Q239 and Q252 are summed, the sum total is approximately 5 mA, and the power consumption in this instance is approximately 25 mW (=5 mA×5 V). In the case of the termination of 50Ω, the power dissipation when the output level of the output transistor Q253 is fixed to a high level is 36 mW as described in connection with the related art hereinabove. Accordingly, comparing with the related art, the power dissipation can be reduced by about 10 mW per one output terminal.

As described so far, according to the present invention, since an ECL output circuit having a power saving function is constructed such that, when a power saving operation is to be performed, the output level of an output transistor is fixed to a low level, the current consumption upon power saving operation can be reduced only by adding a simple circuit.

What is claimed is:

1. An emitter follower circuit, comprising:

an emitter follower stage which has a variable current source connected as a load thereto and to which an input signal is supplied;

a differentiation circuit for differentiating the input signal; and a current mirror circuit paired with said variable current source for supplying a current to said variable current source in response to a differentiation output of said differentiation circuit.

2. An analog to digital converter of the parallel type, comprising:

a reference voltage generation circuit for generating a plurality of reference voltages having different voltage values;

a plurality of comparators for individually comparing an input analog signal with the plurality of reference voltages;

a plurality of gate circuits to which comparison outputs of said plurality of comparators are supplied individually; and an encoder to which outputs of said gate circuits are supplied;

an analog input stage of each of said comparators being constituted using the emitter follower circuit according to claim 1.

3. An emitter follower circuit as set forth in claim 1, wherein said emitter follower stage comprises a first transistor acting as an emitter follower to whose base an input voltage is inputted; a second transistor which serves as a load to the first transistor and as a variable current source, and a resistor connected in series between a pair of power source lines of a ground and a negative power source, the emitter of said first transistor having a parasitic capacitance; wherein the emitter current of said first transistor is adjusted in response to the input voltage by differentiating the input signal by said differentiation circuit to convert the input voltage signal into a current variation, and controlling the current of the second transistor in response to said current variation, whereby a variation of the base-emitter voltage of said first transistor caused by a charging or discharging current flowing through said parasitic capacitance can be suppressed so that an analog distortion which arises from the parasitic capacitance can be reduced.

4. The emitter follower circuit as set forth in claim 3, wherein said current mirror circuit includes a constant-current source, a third transistor connected in a diode configuration, and a resistor connected in series between said ground line and said power source line, an output terminal of said differentiation circuit connected to a junction between the constant-current source and the collector/base connection of said third transistor.

5. The emitter follower circuit as set forth in claim 1 wherein said differentiation circuit and said current mirror circuit together constitute a control circuit comprising a first transistor connected in a diode configuration and a constant-current source connected in series between a ground line and a power source line; a capacitor connected between a junction point between the first transistor and the constant-current source and an input terminal (A) to said control circuit; a resistor and a second transistor connected in series between the ground line and the collector/base of a third transistor, whereby said current mirror circuit is constituted by the first transistor and the second transistor.

6. The emitter follower circuit as set forth in claim 5, wherein when said capacitance is set to be equal to the emitter capacitance in said emitter follower stage, the emitter current in the emitter follower stage can be made a constant.

7. An analog to digital converter, comprising:

a reference voltage generation circuit for generating a plurality of reference voltages having different voltage values;

an analog signal line for providing an analog signal to be converted;

a plurality of comparators including a first plurality of first emitter follower stages to which said analog input signal is supplied, a second plurality of second emitter follower stage to which one of the plurality of reference voltages is supplied, and a third plurality of differential amplifiers for amplifying a difference between outputs of said first and second emitter follower stages, the number of said first and said second emitter follower stages being at least less than the number of said differential amplifiers which in turn are equal to the number of the plurality of comparators;

output terminals of each of the first emitter follower stages being connected in common between said plurality of comparators and providing an input to each of said differential amplifiers.

8. An analog to digital converter according to claim 7, wherein the number of the first plurality of first emitter follower stages is the same as the number of the differential amplifiers.

9. An analog to digital converter according to claim 7 or 8, wherein the first emitter follower stages are disposed in the proximity of the analog input terminal to which the analog input signal is applied.

10. An analog to digital converter, comprising:

a reference voltage generation circuit for generating a plurality of reference voltages having different voltage values; and a plurality of comparators each including a first emitter follower stage to which an analog input signal is supplied, a second emitter follower stage to which one of the plurality of reference voltages is supplied, and a differential amplifier for amplifying a difference between outputs of said first and second emitter follower stages;

output terminals of the second emitter follower stages being connected in common between each adjacent ones of said plurality of comparators by way of a resistor.

11. An analog to digital converter according to claim 10, further comprising a current correction circuit for flowing a current of a value equal to the current flowing through the resistor into the second emitter follower stage of an uppermost one of said plurality of comparators and flowing out such current from the second emitter follower stage of a lowermost one of said plurality of comparators.

* * * * *